United States Patent
Kunick et al.

(10) Patent No.: US 7,002,078 B2
(45) Date of Patent: Feb. 21, 2006

(54) FRONT COVER FOR A MODULE OF A MODULAR DRIVE SYSTEM

(75) Inventors: Matthias Kunick, Seukendorf (DE); Thomas Knobling, Pyrbaum (DE); Manfred Lehner, Baiersdorf (DE); Joachim Masatz, Höchstadt (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 11/023,050

(22) Filed: Dec. 27, 2004

(65) Prior Publication Data

US 2005/0142904 A1    Jun. 30, 2005

Related U.S. Application Data

(63) Continuation of application No. PCT/DE2003/002080, filed on Jun. 23, 2003.

(30) Foreign Application Priority Data

Jul. 5, 2002    (DE) ............... 102 30 393

(51) Int. Cl.
*H02G 3/14* (2006.01)

(52) U.S. Cl. ............... 174/66; 174/67; 174/135; 220/241

(58) Field of Classification Search ........... 174/66, 174/67, 135; 220/241, 242; 361/752
See application file for complete search history.

(56) References Cited

U.S. PATENT DOCUMENTS

| | | | | |
|---|---|---|---|---|
| 5,664,955 A | * | 9/1997 | Arnett .................... | 439/135 |
| 5,977,481 A | * | 11/1999 | Worrell et al. .......... | 174/66 |
| 5,981,875 A | * | 11/1999 | Kesler et al. ........... | 174/66 |
| 6,410,850 B1 | * | 6/2002 | Abel et al. ............. | 174/60 |
| 6,498,728 B1 | * | 12/2002 | Sarno et al. ........... | 361/752 |
| 2002/0072256 A1 | | 6/2002 | Lostoski et al. | |

FOREIGN PATENT DOCUMENTS

| | | |
|---|---|---|
| DE | 198 22 564 A | 12/1999 |
| GB | 1 035 318 A | 7/1966 |
| WO | WO 99/23737 A | 5/1999 |

* cited by examiner

*Primary Examiner*—Dhiru R. Patel
(74) *Attorney, Agent, or Firm*—Henry M. Feiereisen

(57) ABSTRACT

A front cover for a module of a modular drive system includes two intermediate circuit conductor rails arranged in stepped relationship, two supply conductor rails, and a pivotable, engageable hood. Each intermediate circuit conductor rail includes a connection bracket, which is fixed on one end, and a contact screw. The supply conductor rails are provided with a removable connection plug, and the pivotable hood is arranged in such a way that the conductor rails can be covered and the front side of the hood is flush with the cover in the engaged state. In this way, an essentially more compact structure can be achieved, which is also less prone to interference from EMC influences, and in which a supply voltage as well as the intermediate circuit conductor rails are looped.

13 Claims, 3 Drawing Sheets

FRONT COVER FOR A MODULE OF A MODULAR DRIVE SYSTEM

CROSS-REFERENCES TO RELATED APPLICATIONS

This application is a continuation of prior filed copending PCT International application no. PCT/DE2003/002080, filed Jun. 23, 2003, which designated the United States and on which priority is claimed under 35 U.S.C. §120, and which claims the priority of German Patent Application, Serial No. 102 30 393.2, filed Jul. 5, 2002, pursuant to 35 U.S.C. 119(a)–(d).

BACKGROUND OF THE INVENTION

The present invention relates, in general, to a module of a modular drive system having at least two modules disposed in neighboring relationship and electrically connected to each other by a d.c. voltage intermediate circuit, and more particularly to a front cover for attachment to such a module.

Nothing in the following discussion of the state of the art is to be construed as an admission of prior art.

Siemens-Catalog DA 65.11-2001, entitled "SIMOVERT MASTERDRIVES Motion Control", chapter 6, in particular page 6/47, discloses a modular drive system which includes a capacitor module, a feed module with operator panel and seven inverter modules of different outputs. These modules are arranged side-by-side. The intermediate circuit busbar connection of these modules is implemented by a three-phase rail system which includes a plus conductor rail, minus conductor rail and PE ("Potencial Erde"=ground potential) conductor rail. The conductor rails are constructed as standard copper rails. These conductor rails are guided in insulated manner in a guide unit above the modules. The intermediate circuit voltages is generated in the feed module and supported by the capacitor module. The three-phase rail system distributes the generated intermediate circuit d.c. voltage to all inverter modules. In addition, the feed module produces a supply voltage of, for example, 24 V which is supplied to the inverter modules via a two-core cable. This supply voltage is required for feeding the electronic components of the inverter modules.

Siemens-Catalog DA 65.4-2001, entitled "SIMODRIVE 611 universal and POSMO", chapter 6, in particular page 6/26, discloses a modular drive system having modules, with each module having in the lower front portion two stacked intermediate circuit conductor rails. Each intermediate circuit conductor rail includes a connection bracket articulated on one side and a contact screw. By means of these two connection brackets, the intermediate circuit conductor rails of an inverter module are electrically connected to corresponding intermediate circuit conductor rails of a neighboring inverter module. Each connection bracket hooks hereby behind a corresponding contact screw of the neighboring inverter module, and the contact screw is then tightened, thereby establishing a shake-proof contact between the intermediate circuit conductor rails of two neighboring inverter modules. Both these conductor rails are covered by a protective cap which is lined with EMC sheet. The EMC sheet is electrically connected by a line to a PE terminal of a module. Each protective cap further includes lateral spring contacts to electrically interconnect the EMC (electromagnetic compatibility) sheets of the individual modules of the modular drive system. As a result, a PE return line of the modular drive system is looped through all modules. The modules of the modular drive system are connected on the front side by a bus. Each module is provided in an area above the intermediate circuit conductor rails with a bay for closed-loop plug-in unit which is provided on the front side with a multipolar socket for connection of a bus, and further multipolar sockets, of which one includes, i.a., terminals for further conduction of a supply voltage.

A drawback of above modular drive systems resides in the space demand for both intermediate circuit conductor rails. The distance of both these intermediate circuit conductor rails is so dimensioned that the connection bracket of one conductor rail is prevented from touching the other conductor rail, when installing or dismantling an inverter module in or from the modular drive system. This is done at the expense of space in order to prevent an inadvertent shorting of the d.c. voltage intermediate circuit of the modular drive system. Moreover, handling of the terminal of the PE return line is time-consuming and prone to fail. The need for a pre-designed cable strand or several cables is also required for applying the supply voltage across all modules of the modular drive system.

It would therefore be desirable and advantageous to provide an improved module of a modular drive system to obviate prior art shortcomings.

SUMMARY OF THE INVENTION

According to one aspect of the present invention, a front cover for a module of a modular drive system having at least two modules disposed in neighboring relationship and electrically connected to each other by a d.c. voltage intermediate circuit, includes a body member, two intermediate circuit conductor rails arranged on the body member in stepped relationship, each intermediate circuit conductor rail including a connection bracket having one end articulated to the intermediate circuit conductor rail for swinging about an axis, and a contact screw, two supply conductor rails arranged on the body member and having a detachable connection plug, and a hood swingably mounted to and constructed for locking engagement with the body member so as to shield the intermediate circuit conductor rails and supply conductor rails, said hood having a front side which extends flush with the body member, when the hood is secured to the body member.

The present invention resolves prior art problems by disposing the intermediate circuit conductor rails in stepped relationship so that the intermediate circuit conductor rails can be spaced at minimal distance from each other, without regard to a configuration of the connection bracket. This saves significant space for the intermediate circuit conductor rails. The integration of a supply line in the form of two supply conductor rails which are provided with connection plugs eliminates the need for external wiring. In other words, the provision of supply conductor rails and associated connection plugs enables application of a supply voltage through all modules of a modular drive system in a simple manner. As the front-side hood is swingably and lockably connected to the front cover, the hood is captivated and prevents unauthorized persons from working on the intermediate circuit rail system of the modular drive system as unlocking or release of the hood requires a tool.

According to another feature of the present invention, a further conductor rail may be disposed on a backside of the body member of the cover at a location between the intermediate circuit conductor rails and include a contact spring arranged on one side of the conductor rail and a contact plate disposed on another opposite side of the conductor rail. As a result, a PE return line of the modular drive system through all modules is established solely by the adjoining disposition of the modules. Moreover, the provision of the PE return line renders the modular drive system less susceptible to failure, when exposed to EMC impacts.

According to another feature of the present invention, a shield may be provided for surrounding the supply conductor rails. The shield may have a rear spring tab for establishing an electric connection. The provision of the shield also protects the looped supply voltage through the modular drive system against EMC impacts.

According to another feature of the present invention, the intermediate circuit conductor rails are arranged to define an upper intermediate circuit conductor rail and a lower intermediate circuit conductor rail, with the body member of the cover being provided with a projection disposed between the upper and lower intermediate circuit conductor rails in a pivot range of the lower intermediate circuit conductor rail.

According to another feature of the present invention, the connection plug may be constructed in the form of two plug components and two conductor pieces which connect the plug components.

According to another feature of the present invention, a protective plate may be provided on either side of the supply conductor rails. Suitably, the supply conductor rails are provided with a rear plug.

According to another feature of the present invention, each of the intermediate circuit conductor rails may be provided with a rear terminal pin.

According to another feature of the present invention, the body member of the cover may have a plate-shaped configuration in an area below a point of articulation of the hood to the body member.

According to another feature of the present invention, a fastener may be provided for securing the hood to the body member.

According to another feature of the present invention, the body member may be constructed as an injection-molded plastic part.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
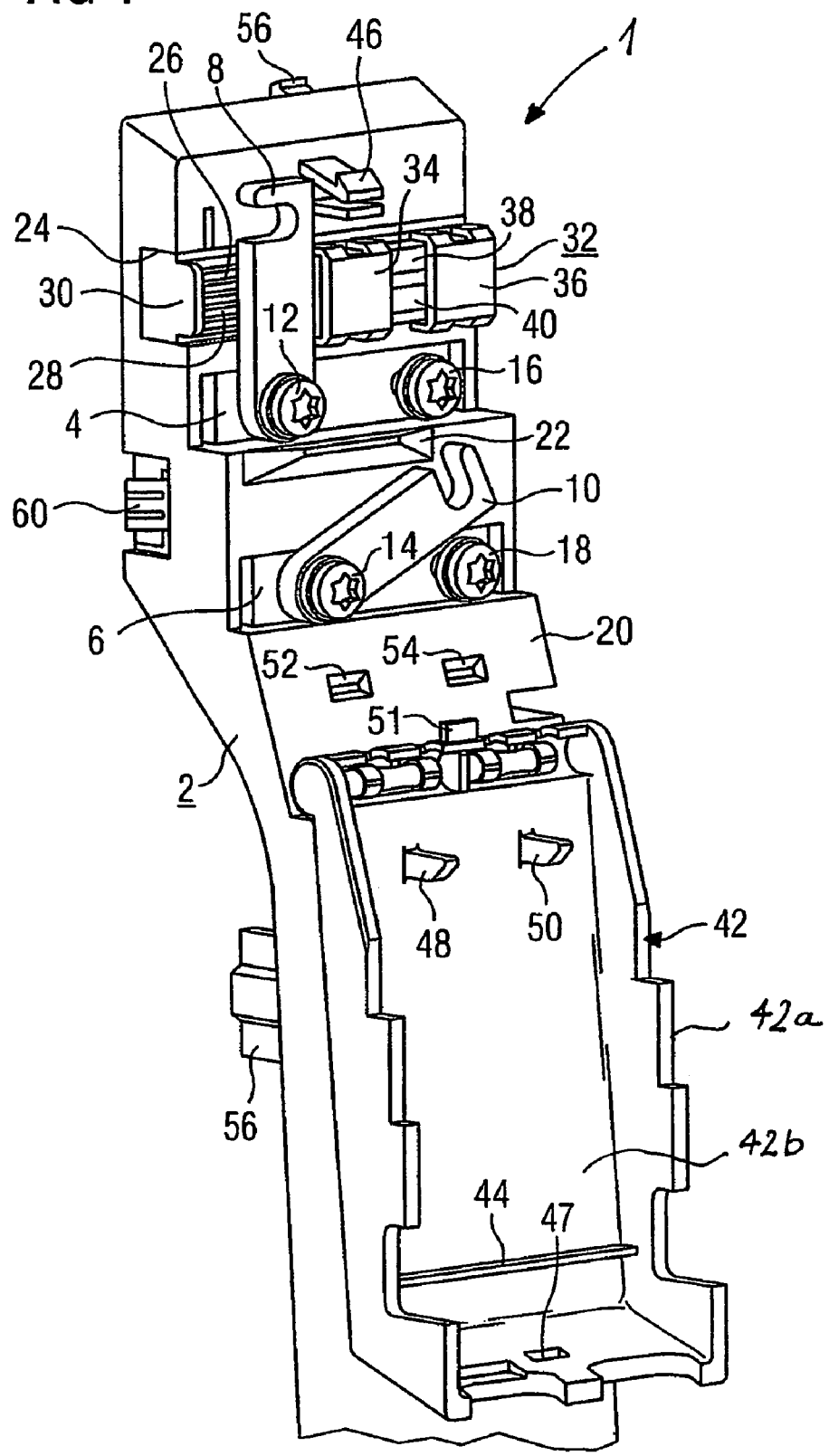
FIG. 1 is a perspective illustration of an upper portion of a front cover according to the present invention.

Throughout all the Figures, same or corresponding elements are generally indicated by same reference numerals. These depicted embodiments are to be understood as illustrative of the invention and not as limiting in any way. It should also be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a perspective illustration of an upper portion of a front cover according to the present invention, generally designated by reference numeral 1 for a module of a modular drive system. The front cover 1 has an elongate body member 2 which is provided in the upper portion on its front face 20 with two intermediate circuit conductor rails 4, 6 disposed in stepped relationship. As a result of this offset and parallel disposition of the intermediate circuit conductor rails 4, 6, the upper portion of the cover 1 can be constructed at minimum material thickness. The remaining portion of the body member 2 of the cover 1 has a plate-shaped configuration, shown only partially in FIG. 1. The transition from upper portion to plate-shaped lower portion of the cover 1 has an arched configuration to save material. A connection bracket 8 has one end articulated to the intermediate circuit conductor rails 4 and is connectable to a corresponding intermediate circuit conductor rail 4 of a neighboring module of the modular drive system by a screw fastener 12. Likewise, a connection bracket 10 has one end articulated to the intermediate circuit conductor rails 6 and connectable to a corresponding intermediate circuit conductor rail 6 of a neighboring module of the modular drive system by a screw fastener 14. Each of the connection brackets 8, 10 has an upper hook-shaped member at the end distal to the screw fastener 12, 14. At its side distal to the screw fastener 12, the conductor rail 4 is provided with a contact screw 16, with the hook-shaped member of the connection bracket 8 of a neighboring module (not shown) of the modular drive system to the right engaging behind the head portion of the contact screw 16. Likewise, the conductor rail 6 is provided at its side distal to the screw fastener 14 with a contact screw 18, with the hook-shaped member of the connection bracket 10 of the neighboring module (not shown) of the modular drive system to the right engaging behind the head portion of the contact screw 18. In order to provide a shake-free electric connection between neighboring intermediate circuit conductor rails of neighboring modules, the contact screws 16, 18 of the cover 1 and the screw fasteners 12, 14 of an unillustrated neighboring module to the right are tightened.

The body member 2 of the cover 1 is further provided with a projection 22 which juts out from the front face 20 at a location above the intermediate circuit conductor rail 6 so as to prevent an inadvertent shorting of the intermediate circuit conductor rails 4, 6, when the screw fasteners 12, 14 are loosened. As shown in combination with FIG. 2, which is a side view of the front cover 1, the projection 22 is so constructed as to prevent the connection bracket 10 from touching the connection bracket 8 or its screw fastener 12, regardless of the pivoting range of the connection bracket 10.

The front face 20 of the body member 2 of the cover 1 is formed above the intermediate circuit conductor rail 4 with a groove 24 for receiving two supply conductor rails 26, 28 which are arranged in a U-shaped mounting closed on opposite ends by protective plates 30 for providing a protection against accidental touching. To reduce susceptibility to EMC impacts, the U-shaped mounting is surrounded by a shield. Attached to the supply conductor rails 26, 28 is a connection plug 32 comprised of two plug components 34, 36 in spaced-apart relationship and two conductor pieces 38, 40. When the module is in idle mode, the connection plug 32 with its plug components 34, 36 is secured to the supply conductor rails 26, 28 of this module to thereby hold the connection plug 32 captivate on the cover 1. When the module is to be connected to the modular drive system and made operative, the plug component 36 of the connection plug 32 is connected to the supply conductor rails 26, 28, whereas the plug component 34 of the connection plug 32 is connected to the supply conductor rails 26, 28 of an already connected module in the modular drive system. The connection plug 32 assumes the function of a two-core current bridge circuit. The conductor pieces 38, 40 enable a relative movement between the plug components 34, 36 so that the linking process or the disconnection can be implemented in the absence of any tool and in a simple manner.

For attachment to a module, the cover 1 further includes a hood 42 which is swingably mounted to the front face 20 of the body member 1 and thus held captive. To provide a support for the hood 42 upon the upper portion of the body member 2 of the cover 1, the hood 42 has stepped sidewalls 42a and an interior space 42b. The stepped sidewalls 42a match the stepped configuration of the front face 20 of the cover 1. The hood 42 is further provided in the interior space 42b with a crossbar 44 which bears upon the plug components 34, 36, when the hood 42 is swung upwards to a closed position and thereby protects the plug components 34, 36 of the connection plug 32 against shocks.

Figure 2:
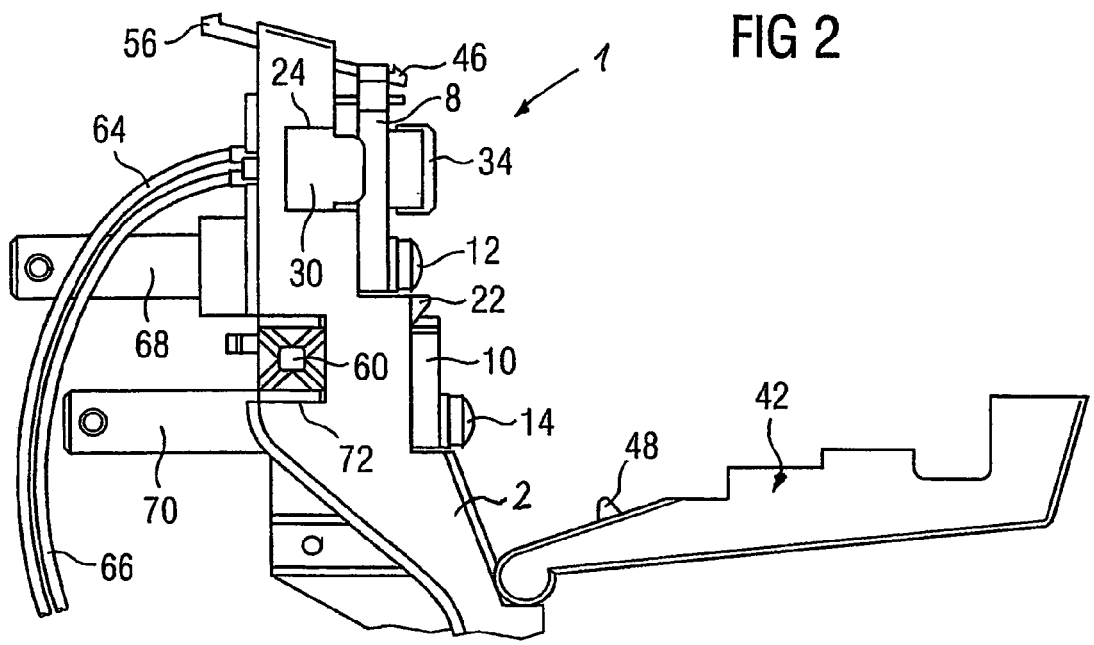
FIG. 2 is a side view of the front cover of FIG. 1.

As further shown in FIGS. 1 and 2, the cover 1 is provided in proximity of its upper end with a resilient locking device 46 projecting out from the front face 20 and constructed in the form of a hook-shaped tab The locking device 46 engages a complementary opening 47 of the hood 42, when the hood 42 assumes the closed position. As soon as the hood 42 is closed and locked, release of the hood 42 is possible only through application of a tool, e.g. screwdriver.

Formed in the interior space 42b of the hood 42 are two centering pins 48, 50 which engage complementary bores 52, 54 in the front face 20 of the cover 1, when the hood 42 is closed. In addition, the hood 42 includes a lug 51 which rests on the front face 20 of the cover 1, when the hood 42 is closed. As a consequence, the locked, hinged connection of the hood 42 with the front face 20 of the cover 1 cannot be pried open, thereby preventing unauthorized access to the live intermediate circuit conductor rails 4, 6 during operation.

Figure 3:
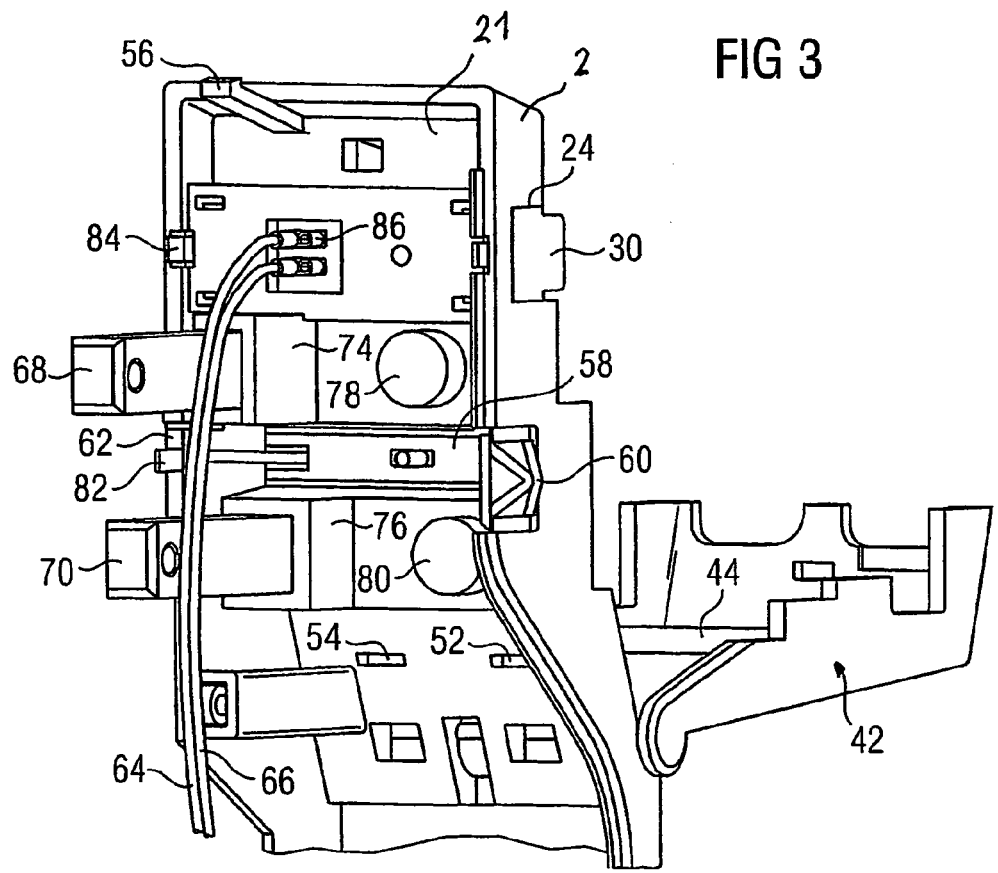
FIG. 3 is a rear perspective view of the front cover of FIG. 1.

The cover 1 further includes several fastening devices 56 (only two are shown here) provided on a rear face 21 of the cover 1, as shown in FIG. 3. Attached to the rear side 21 of the cover 1 is also a conductor rail 58 which is received in a groove 72 (FIG. 2) at a location in midsection between the intermediate circuit conductor rails 4, 6 on the front side 20 and is provided on one side with a contact spring 60 (shown also in FIG. 1). The mating contact to the contact spring 60 is a contact plate 62 on the opposite side of the conductor rail 58. The contact spring 60, the contact plate 62 and the rear conductor rail 58 are suitably made of single-piece construction.

As shown in FIG. 2, the supply voltage, e.g. 24 V of the supply conductor rails 26, 28, is conducted via lines 64, 44 into the interior of an attached unillustrated module. Also the potentials of the intermediate circuit conductor rails 4, 6 are routed via terminal pins 68, 70 into the interior of the attached module. The terminal pins 68, 70 have a substantially cuboid configuration, as shown in FIG. 3, and extend through respective guide cylinders 74, 76. The terminal pin 68 is connected hereby to the intermediate circuit conductor rail 4, suitably in single-piece construction, whereas the terminal pin 70 is connected to the intermediate circuit conductor rail 6, also suitably in single-piece construction. The structure of terminal pin 68, 70 and pertaining intermediate circuit conductor rail 4, 6 thus has a T-shaped configuration and is routed with the terminal pin through the respective cuboid guide cylinder 74, 76, when the intermediate circuit conductor rail 4, 6 is secured to the body member 2 of the cover 1. Of course, the single-piece construction represents only a currently preferred embodiment, and it is certainly conceivable to bolt together the terminal pins 68, 70 and the intermediate circuit conductor rails 4, 6, respectively, suitably using the contact screws 16, 18.

As further shown in FIG. 3, the rear side 21 of the cover 1 is provided with pockets 78, 80 for receiving nuts for the screw fasteners 12, 14 of the intermediate circuit conductor rails 4, 6. In other words, the nuts of the screw fasteners 12, 14 are molded around.

The rear conductor rail 58 is further provided with a spring tab 82 to establish an electrically conductive connection, when the cover 1 is mounted to a module, between the casing of the module and the conductor rail 58. Likewise, the shield for the supply conductor rails 26, 28 has a spring tab 84 to establish an electric connection between the module casing and the shield. The lines 64, 66 for directing the supply voltage to the interior of the module are connected to the front supply conductor rails 26, 28 by means of a plug 86.

Figure 4:
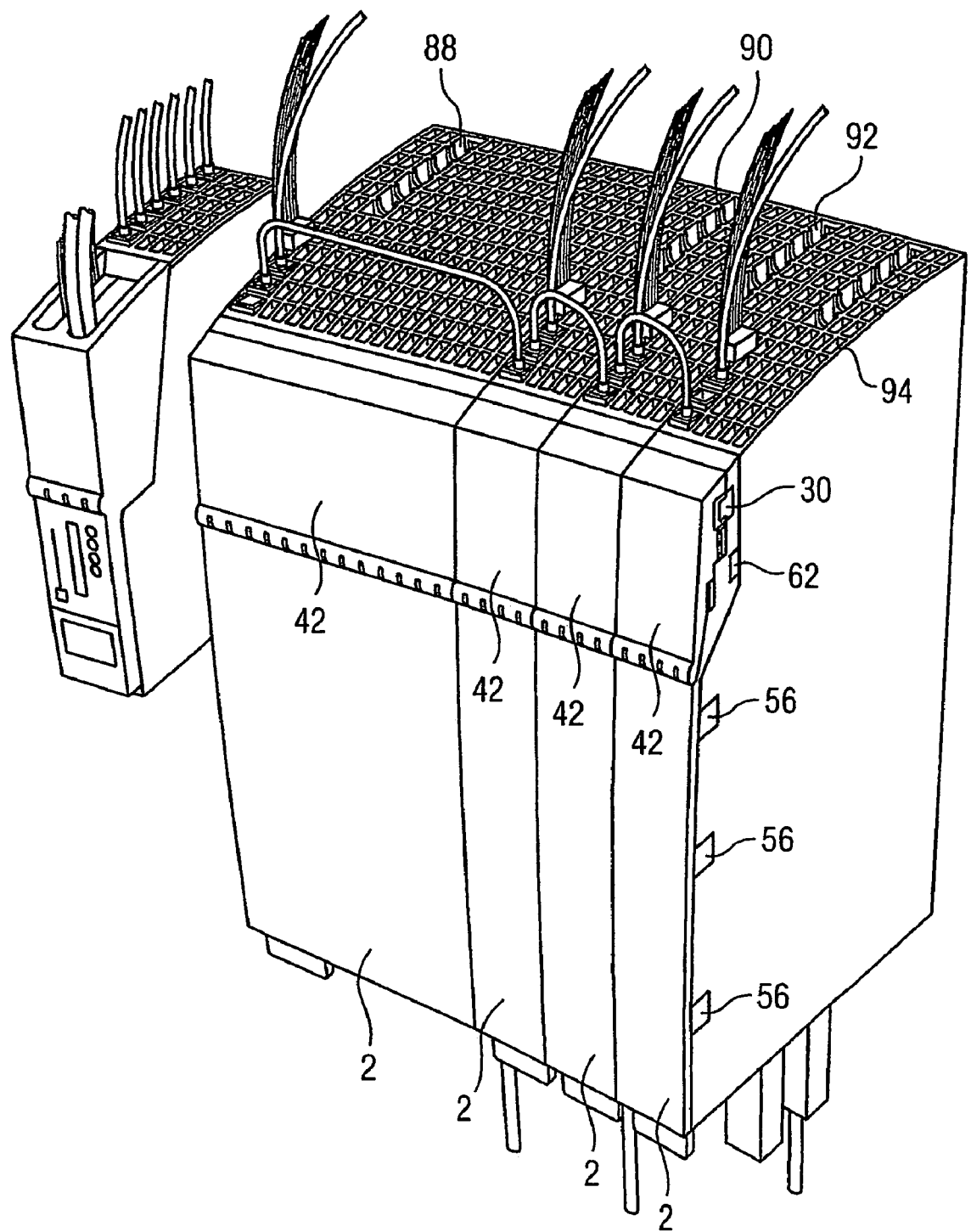
FIG. 4 is a perspective illustration of a modular drive system with plural modules which are each provided with a front cover according to the present invention.

Referring now to FIG. 4, there is shown a perspective illustration of a modular drive system with plural modules 88, 90, 92, 94 which are each provided with a front cover 1 according to the present invention. The modules 88, 90, 92, 94 involve a feed module 88 and three inverter modules 90, 92, 94. The use of a front cover 1 for each of the modules 88, 90, 92, 94 provides a modular drive system with continuously smooth front side which may be dyed in two colors. Housed below the pivotable hoods 42 is the looped intermediate circuit rail system and the looped supply voltages. As a result of the novel and inventive configuration of the disposition of the intermediate circuit conductor rails 4, 6, the upper portion of the cover 1 can be constructed substantially more compact. As the supply conductor rails 26, 28 are also received in the upper cover portion, which can be closed by the hood 42, the need for a separate infeed of a supply voltage to each module 90, 92, 94 is eliminated.

Currently preferred is the construction of the cover 1 in the form of a plastic injection-molded part.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

What is claimed is:

1. A front cover for a module of a modular drive system having at least two modules disposed in neighboring relationship and electrically connected to each other by a d.c. voltage intermediate circuit, said front cover comprising:
   a body member;
   two intermediate circuit conductor rails arranged on the body member in stepped relationship, each of said two intermediate circuit conductor rails including a connection bracket having one end articulated to one of the intermediate circuit conductor rails for swinging about an axis, and a contact screw;

two supply conductor rails arranged on the body member and having a detachable connection plug; and a hood swingably mounted to and constructed for locking engagement with the body member so as to allow a covering of the intermediate circuit conductor rails and supply conductor rails, said hood having a front side which extends flush with the body member, when the hood is secured to the body member.

2. The cover of claim 1, and further comprising a conductor rail disposed on a backside of the body member at a location between the intermediate circuit conductor rails and having a contact spring arranged on one side of the conductor rail and a contact plate disposed on another opposite side of the conductor rail.

3. The cover of claim 1, and further comprising a shield for surrounding the supply conductor rails.

4. The cover of claim 1, wherein the shield has a rear spring tab for establishing an electric connection.

5. The cover of claim 1, wherein the intermediate circuit conductor rails are arranged to define an upper intermediate circuit conductor rail and a lower intermediate circuit conductor rail, said body member provided with a projection disposed between the upper and lower intermediate circuit conductor rails in a pivot range of the lower intermediate circuit conductor rail.

6. The cover of claim 1, wherein the connection plug is constructed in the form of two plug components and two conductor pieces which connect the plug components.

7. The cover of claim 1, and further comprising a protective plate on either side of the supply conductor rails.

8. The cover of claim 1, wherein the supply conductor rails are provided with a rear plug.

9. The cover of claim 1, wherein each of the intermediate circuit conductor rails is provided with a rear terminal pin.

10. The cover of claim 1, wherein the body member has a plate-shaped configuration in an area below a point of articulation of the hood to the body member.

11. The cover of claim 1, and further comprising fastening means for securing the hood to the body member.

12. The cover of claim 1, wherein the body member is constructed as an injection-molded plastic part.

13. The cover of claim 1, wherein the hood has a configuration to complement the front side of the body member.

* * * * *